(12) United States Patent
Liu et al.

(10) Patent No.: US 11,107,430 B2
(45) Date of Patent: Aug. 31, 2021

(54) METHOD OF PREVENTING FALSE OUTPUT OF GOA CIRCUIT OF A LIQUID CRYSTAL DISPLAY PANEL

(71) Applicants: BOE TECHNOLOGY GROUP CO., LTD., Beijing (CN); Hefei Xinsheng Optoelectronics Technology Co., Ltd., Anhui (CN)

(72) Inventors: Yuanyuan Liu, Beijing (CN); Jianjun Wang, Beijing (CN); Hongjun Wang, Beijing (CN); Min Wang, Beijing (CN); Rui Ma, Beijing (CN)

(73) Assignees: BOE TECHNOLOGY GROUP CO., LTD., Beijing (CN); Hefei Xinsheng Optoelectronics Technology Co., Ltd., Anhui (CN)

(*) Notice: Subject to any disclaimer, the term of this patent is extended or adjusted under 35 U.S.C. 154(b) by 725 days.

(21) Appl. No.: 15/777,591

(22) PCT Filed: Jun. 7, 2017

(86) PCT No.: PCT/CN2017/087441
§ 371 (c)(1),
(2) Date: May 18, 2018

(87) PCT Pub. No.: WO2018/223313
PCT Pub. Date: Dec. 13, 2018

(65) Prior Publication Data
US 2021/0174758 A1    Jun. 10, 2021

(51) Int. Cl.
*G09G 3/36* (2006.01)
*G06F 1/06* (2006.01)
(Continued)

(52) U.S. Cl.
CPC ............ *G09G 3/3677* (2013.01); *G06F 1/06* (2013.01); *G06F 1/14* (2013.01); *G09G 3/3648* (2013.01);
(Continued)

(58) Field of Classification Search
CPC ... G09G 2310/0286; G09G 2310/0283; G09G 2310/0289; G09G 2310/061;
(Continued)

(56) References Cited

U.S. PATENT DOCUMENTS 8,232,941 B2* 7/2012 Yeo ...................... G09G 3/3677
345/87
8,860,652 B2* 10/2014 Yamashita ........... G09G 3/3674
345/100

(Continued)

*Primary Examiner* — Dismery Mercedes
(74) *Attorney, Agent, or Firm* — Intellectual Valley Law, P.C.

(57) ABSTRACT

The present application discloses a method for preventing false output of a GOA circuit in a display panel. The method includes providing N clock signals respectively to N GOA units in each of M groups of GOA units cascaded in series. The N clock signals are outputted time-sequentially from a 1st clock signal to a N-th clock signal. The method additionally includes counting a first total number of pulses of the 1st clock signal and a second total number of pulses of the N-th clock signal, comparing each of them to M, and generating a reset signal based on a determination that at least one of the first total number of pulses and the second total number of pulses is smaller than M. The method furthermore includes releasing residual charges of the GOA circuit without outputting any gate-driving signal for a duration of time.

20 Claims, 7 Drawing Sheets

(51) Int. Cl.
*G11C 19/28* (2006.01)
*G06F 1/14* (2006.01)

(52) U.S. Cl.
CPC ......... *G09G 3/3696* (2013.01); *G11C 19/287* (2013.01); *G09G 2310/0286* (2013.01); *G09G 2310/061* (2013.01); *G09G 2310/08* (2013.01)

(58) Field of Classification Search
CPC ............ G09G 2310/08; G09G 3/3677; G09G 3/3648; G09G 3/20; G09G 3/3674; G09G 3/3696; G09G 3/3225; G06F 3/04166; G06F 3/0446; G06F 3/0416; G06F 3/038; G06F 1/06; G06F 1/14; G11C 19/287; G11C 27/04
See application file for complete search history.

(56) References Cited

U.S. PATENT DOCUMENTS

| | | | |
|---|---|---|---|
| 9,147,370 B2* | 9/2015 | Tobita | G09G 3/3688 |
| 9,483,990 B2* | 11/2016 | Xiao | G11C 19/184 |
| 9,818,361 B2* | 11/2017 | Xiao | G09G 3/3677 |
| 9,997,117 B2* | 6/2018 | Cao | G09G 3/006 |
| 10,104,318 B2* | 10/2018 | Smith | H04N 5/347 |
| 10,204,547 B2* | 2/2019 | Park | G09G 3/3688 |
| 10,223,992 B2* | 3/2019 | Du | G09G 3/3677 |
| 10,332,471 B2* | 6/2019 | Huang | H03K 21/08 |
| 10,916,170 B2* | 2/2021 | Li | G09G 3/20 |
| 10,937,516 B2* | 3/2021 | Tao | G11C 19/287 |
| 2016/0351109 A1* | 12/2016 | Han | G09G 3/20 |

\* cited by examiner

METHOD OF PREVENTING FALSE OUTPUT OF GOA CIRCUIT OF A LIQUID CRYSTAL DISPLAY PANEL

CROSS-REFERENCE TO RELATED APPLICATION

This application is a national stage application under 35 U.S.C. § 371 of International Application No. PCT/CN2017/087441, filed Jun. 7, 2017, the contents of which are incorporated by reference in the entirety.

TECHNICAL FIELD

The present invention relates to field of electronics and liquid crystal display, more particularly, to a method for preventing false output of a Gate Driver on Array circuit in a thin-film transistor liquid-crystal display panel and a thin-film transistor liquid-crystal display panel.

BACKGROUND

Thin-Film Transistor Liquid Crystal Display (TFT-LCD) technology has been widely adopted for many kinds of image display applications. Gate Driver on Array (GOA) technique is often applied to drive image display of the TFT-LCD panel, especially for the display product with narrow-border panel or even borderless panel. The GOA technique is to directly integrate a gate-driving circuit on a glass panel for driving the thin-film transistors for controlling image pixels of the panel. Advantages of the GOA technique include enhancing productivity in modular process, reducing manufacture costs, and facilitating development of narrow-border panel, and others. A GOA circuit includes a plurality of GOA units cascaded in series and is relatively harder to adjust each GOA unit in the series compared to Gate-integrated circuit. Therefore, typical GOA circuit includes a Reset GOA unit for resetting the GOA circuit to prevent abnormal outputs from being outputted to the gate lines of the TFT-LCD panel. For narrow-border or borderless display panel, this Reset GOA unit may be removed to yield more room for signal line layout. Thus, an issue of potential false output of GOA circuit needs to be solved.

SUMMARY

In one aspect, the present disclosure provides a display panel, comprising a Gate Driver on Array (GOA) circuit comprising M groups of GOA units cascaded in series, each of the M groups of GOA units comprising N GOA units cascaded in series; and N clock signal lines each of which is connected to one of the N GOA units in each of M groups of GOA units, M and N are integer; a controller configured to set a first GOA timing for providing N clock signals sequentially from a 1st clock signal to a N-th clock signal respectively through the N clock signal lines to the N GOA units in one group sequentially from a 1st group to a M-th group of the M groups of GOA units for outputting M×N gate-driving signals from the GOA circuit in each scanning period of a frame of image; a first pulse counter to count a first number of pulses of the 1st clock signal provided within the each scanning period; and a second pulse counter to count a second number of pulses of the N-th clock signal provided in the each scanning period.

Optionally, the controller is configured to reset the first GOA timing to a second GOA timing based on a reset signal indicating that at least one of the first number of pulses and the second number of pulses is smaller than M. The second GOA timing is delayed from the first GOA timing by a duration of time. The controller is configured to release residual charges in each GOA unit for the duration of time without outputting any gate-driving signal before providing the N clock signals based on the second GOA timing.

Optionally, the N clock signals sequentially from the 1st clock signal to the N-th clock signal are provided with a time-delay between any pair of subsequent clock signals.

Optionally, the time-delay equals to I/N of one period of each clock signal.

Optionally, each of the N clock signals applies a first high-level pulse voltage in a first period of the clock signal to one GOA unit of the 1st group of the M groups of GOA units and applies each subsequent next high-level pulse voltage in each subsequent next period of the clock signal to another one GOA unit of each subsequent next group of the M groups of GOA units.

Optionally, the first pulse counter is configured to receive the 1st clock signal and enable counting of numbers of rising edges of pulses of the 1st clock signal to obtain the first total number of pulses within a duration of scanning period of a full frame of image; and the second pulse counter is configured to receive the N-th clock signal and enable counting of numbers of rising edges of pulses of the N-th clock signal to obtain the second total number of pulses within the duration of scanning period of a full frame of image.

Optionally, the display panel further comprises a first timer coupled to the first pulse counter and a second timer coupled to the second pulse counter. Optionally, each of the first timer and the second timer is configured to independently define a duration of counting interval to be the duration of scanning period of a full frame of image. Optionally, the first timer is configured to send a first clear signal to the first pulse counter for clearing the first pulse counter at an end of the duration of counting interval; and the second timer is configured to send a second clear signal to the second pulse counter for clearing the second pulse counter at the end of the duration of counting interval.

Optionally, the first pulse counter comprises a first comparator configured to compare the first total number of pulses to M and to output a first output signal. Optionally, the first output signal is a high-level signal indicating a determination that the first total number of pulses is equal to M or a low-level signal indicating a determination that the first total number of pulses is smaller than M. The second pulse counter comprises a second comparator configured to compare the second total number of pulses to M and to output a second output signal. Optionally, the second output signal is a high-level signal indicating a determination that the second total number of pulses is equal to M or a low-level signal indicating a determination that the second total number of pulses is smaller than M.

Optionally, the display panel further comprises a logic AND device to receive the first output signal from the first pulse counter and the second output signal from the second pulse counter and to output a low-level signal as the reset signal indicating that at least one of the first output signal and the second output signal is a low-level signal or to output a high-level signal indicating that each of the first output signal and the second output signal is a high-level signal.

Optionally, the controller is configured to discontinuing the N clock signals based on the reset signal for the duration of time before providing the N clock signals based on the second GOA timing.

Optionally, the controller is configured to provide a high-level power-supply voltage to a charge-releasing sub-circuit of each GOA unit in the GOA circuit to release residual charges thereof within the duration of time.

Optionally, the controller is configured to maintain the first GOA timing based on the high-level signal outputted by the logic AND device to provide the N clock signals in a subsequent next scanning period of a frame of image for outputting M×N gate-driving signals sequentially from the 1st GOA unit of the 1st group to the N-th GOA unit of the M-th group.

In another aspect, the present disclosure provides a method for preventing false output of a Gate Driver on Array (GOA) circuit in a display panel. The GOA circuit comprises M groups of GOA units cascaded in series, each of the M groups of GOA units comprising N GOA units cascaded in series, and N clock signal lines each of which is connected to one of the N GOA units in each of the M groups of GOA units, M and N are integer. The method comprises providing N clock signals time-sequentially from a 1st clock signal to a N-th clock signal through the N clock signal lines respectively to the N GOA units in each of the M groups of GOA units; counting a first total number of pulses of the 1st clock signal and a second total number of pulses of the N-th clock signal provided in a scanning period of a frame of image; comparing the first total number of pulses and the second total number of pulses to M; generating a reset signal based on a determination that at least one of the first total number of pulses and the second total number of pulses is smaller than M, thereby releasing residual charges in the GOA circuit before outputting any gate-driving signal for a duration of time based on the reset signal.

Optionally, the providing N clock signals comprises sequentially outputting the N clock signals from the first clock signal to the N-th clock signal with a time-delay.

Optionally, the time-delay equals to 1/N of one period of each clock signal.

Optionally, each of the N clock signals applies a first high-level pulse voltage in a first period of the clock signal to one GOA unit of the 1st group of the M groups of GOA units and applies each subsequent next high-level pulse voltage in each subsequent next period of the clock signal to another one GOA unit of each subsequent next group of the M groups of GOA units.

Optionally, the counting comprises obtaining the first total number of pulses within each scanning period of one frame of image using a first pulse counter including an input port receiving the 1st clock signal and an enable port receiving a high-level voltage to enable counting of numbers of rising edges of pulses of the 1st clock signal, the scanning period of one frame of image is set by a timer which is configured to clear the first pulse counter at an end of the each scanning period; and obtaining the second total number of pulses within each scanning period of one frame of image using a second pulse counter including an input port receiving the N-th clock signal and an enable port receiving a high-level voltage to enable counting of numbers of rising edges of pulses of the N-th clock signal, the scanning period of one frame of image is set by a timer which is configured to clear the second pulse counter at an end of the each scanning period.

Optionally, the comparing comprises comparing the first total number of pulses to M using a first comparator associated with the first pulse counter and outputting a first output signal, wherein the first output signal is a high-level signal indicating that the first total number of pulses is equal to M or is a low-level signal indicating that the first total number of pulses is smaller than M. The comparing comprises comparing the second total number of pulses to M using a second comparator associated with the second pulse counter and outputting a second output signal. Optionally, the second output signal is a high-level signal indicating that the second total number of pulses is equal to M or is a low-level signal indicating that the second total number of pulses is smaller than M.

Optionally, the generating the reset signal comprises receiving the first output signal from the first pulse counter and the second output signal from the second pulse counter by a logic AND device; and outputting by the logic AND device a low-level signal as the reset signal based on that at least one of the first output signal and the second output signal is a low-level signal or outputting a high-level signal based on that each of the first output signal and the second output signal is a high-level signal.

Optionally, the method further comprises discontinuing the N clock signals based on the reset signal for the duration of time before providing the N clock signals in a next scanning period of a frame of image subsequently after the duration of time.

Optionally, the releasing residual charges in the GOA circuit comprises providing a high-level power-supply voltage to a charge-releasing sub-circuit of each GOA unit in the GOA circuit to release residual charges thereof within the duration of time.

Optionally, the method further comprises maintaining a timing for providing the N clock signals in a subsequent next scanning period of a frame of image based on the high-level signal outputted by the logic AND device for outputting M×N gate-driving signals sequentially from the 1st GOA unit of the 1st group to the N-th GOA unit of the M-th group.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the field of TFT-LCD panel, there are increasing demands on narrow-border panels or borderless panels, which provide only very limited space for signal line layout when integrating the GOA circuit on the panel. One approach to meet these demands is to remove the Reset GOA unit from the GOA circuit. For most GOA circuits using DC power supply, they are formed by cascading a plurality of GOA units in series and each GOA unit is supplied with a Start signal STV, multiple clock signals CLK, and one or more power-supply voltages VDD. The clock signals CLK are used as driving signals for outputting a corresponding gate-driving signal from each GOA unit. The power-supply voltages VDD are used in a sub-circuit of GOA unit to perform a reset operation to release residual charges in certain nodes. Since the GOA circuit is a cascaded circuit with multi-stage GOA units, a GOA unit of a certain stage receives a feedback signal from another GOA unit at another stage in the series to perform the reset operation. It is required to operate the GOA circuit by providing the multiple clock signals in a full cycle over a complete scanning period of a frame of image to allow each GOA unit to be able to perform the corresponding reset operation. Whenever, for any reason, one or more clock signals are not completely outputted in a scanning period of a frame of image, one or more GOA units are not able to reset, resulting in certain nodes with high-level potential due to unreleased residual charges. As the GOA circuit continues to output gate-driving signals, the unreleased residual charges in some GOA units will cause abnormal outputs and spread through the cascaded structure of the GOA circuit to all GOA units, resulting abnormal image display.

Figure 1A:
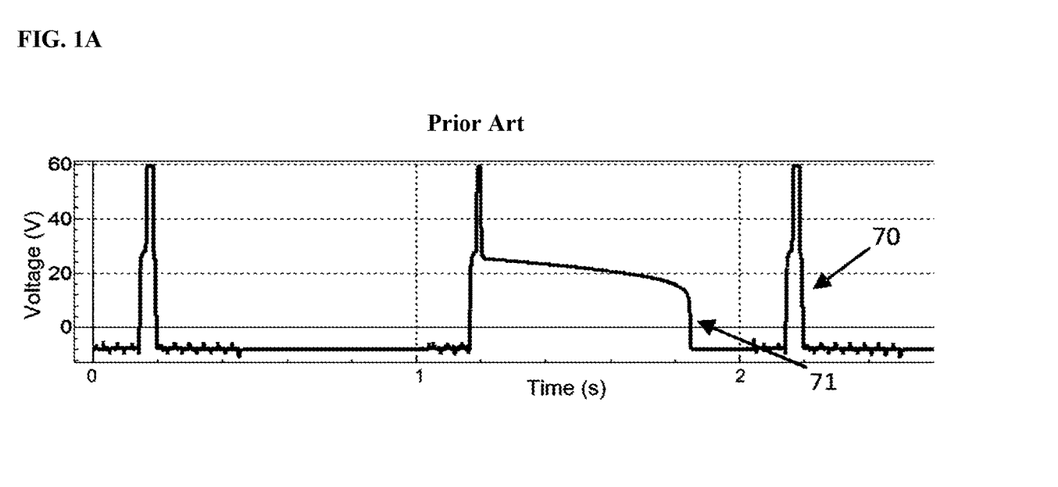
FIG. 1A is an exemplary diagram showing a normal output of a gate-driving signal outputted from a GOA unit of a GOA circuit.
Figure 1B:
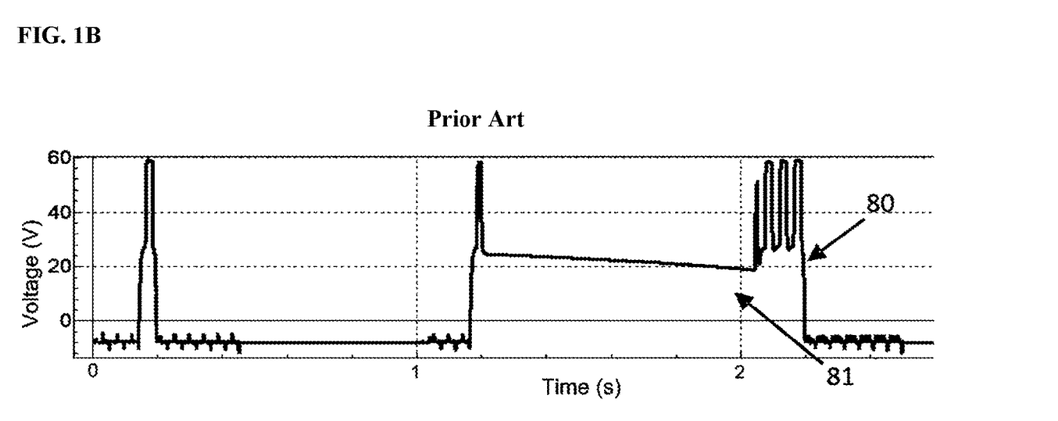
FIG. 1B is an exemplary diagram showing a false output of agate driving signal outputted from a GOA unit of a GOA circuit.

FIG. 1A is an exemplary diagram showing a normal output of a gate-driving signal outputted from a GOA unit of a GOA circuit. FIG. 1B is an exemplary diagram showing a false output of a gate driving signal outputted from a GOA unit of a GOA circuit. As shown, in a situation all clock signals are properly outputted to respective GOA units over each scanning period of a frame of image, VDD power-supply voltage supplied to each stage GOA unit is able to provide power for that GOA unit to perform its reset operation during a certain timing period. Referring to FIG. 1A, the effect of the reset operation is shown as residual charge release 71 at some circuit nodes of a GOA unit as indicated by a quick drop of voltage level in the graph. The reset operation is done after the output of a previous gate-driving signal. With the full release of residual charges, the GOA unit is able to output next gate-driving signal 70 normally. The gate-driving signal normally should be a high-level pulse voltage configured to turn on a gate of a pixel control transistor to enable light emission of the pixel. If a low-level voltage is outputted from the GOA unit, it merely leads to a dark pixel. Referring to FIG. 1B, for any reason that the reset operation is failed (either due to current GOA unit or spread from neighboring GOA units), the residual charge release 81 is not properly done. As a result, the next gate-driving signal 80 outputted by the GOA unit becomes abnormal shown with multiple peaks. Multiple peaks in the gate-driving signal would cause abnormal light emissions in certain pixels. Because of cascaded structure of the GOA circuits, the abnormity can spread to other pixels in different locations on the display panel, resulting in non-uniform intensity in displayed image.

Accordingly, the present invention provides, inter alia, a method, in association with a display panel (e.g., a TFT-LCD panel) having a GOA circuit having a plurality of GOA units cascaded in series without using a Reset GOA unit, for preventing false outputs of gate-driving signals from the GOA circuit during each scanning period of a frame of image. Further the present invention provides an improved display panel (e.g., a TT-LCD panel) that substantially obviates one or more of problems due to limitations and disadvantages of the related art.

Figure 2:
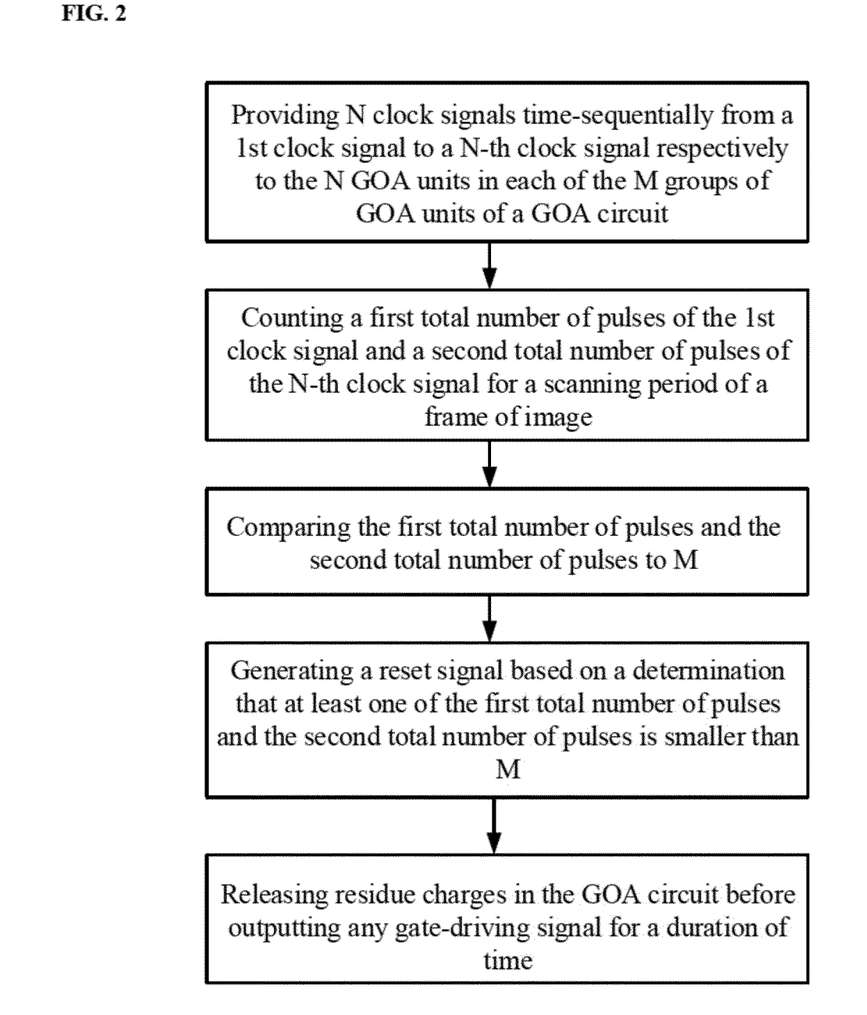
FIG. 2 is a flow chart showing a method of preventing false output of a GOA circuit in a TFT-LCD panel according to some embodiments of the present disclosure.

In one aspect, a method of preventing false output of a GOA circuit is provided. FIG. 2 is a flow chart showing the method of preventing false output of a GOA circuit in a TFT-LCD panel according to some embodiments of the present disclosure. Merely illustrated as an example, the GOA circuit includes M groups of GOA units cascaded in series and each of the M groups of GOA units includes N GOA units cascaded in series. The GOA circuit includes N clock signal lines each of which is connected to one of the N GOA units in each of the M groups of GOA units. Here M and N are integer selected based on resolution of the display panel and the GOA circuit design. For a full high definition (FHD)-type display panel with 1920×1080 resolution, if the GOA circuit is designed with cascaded GOA unit series in a n+4 reset configuration, 6 clock signals are provided as gate driving signals. Integer N is 6, and integer M accordingly is 180. The present method is applicable to any TFT-LCD panels with any resolution level. Similarly, the present method is applicable to any display panels (e.g., TFT-LCD panels) having a GOA circuit designed to provide any appropriate numbers of clock signals for operating each GOA unit to output a gate-driving signal to a corresponding gate line of the display panel. Normally, a gate-driving signal should be a high-level pulse voltage signal for tuning on all transistors sharing the gate line of the display panel (e.g., the TFT-LCD panel).

Figure 3:
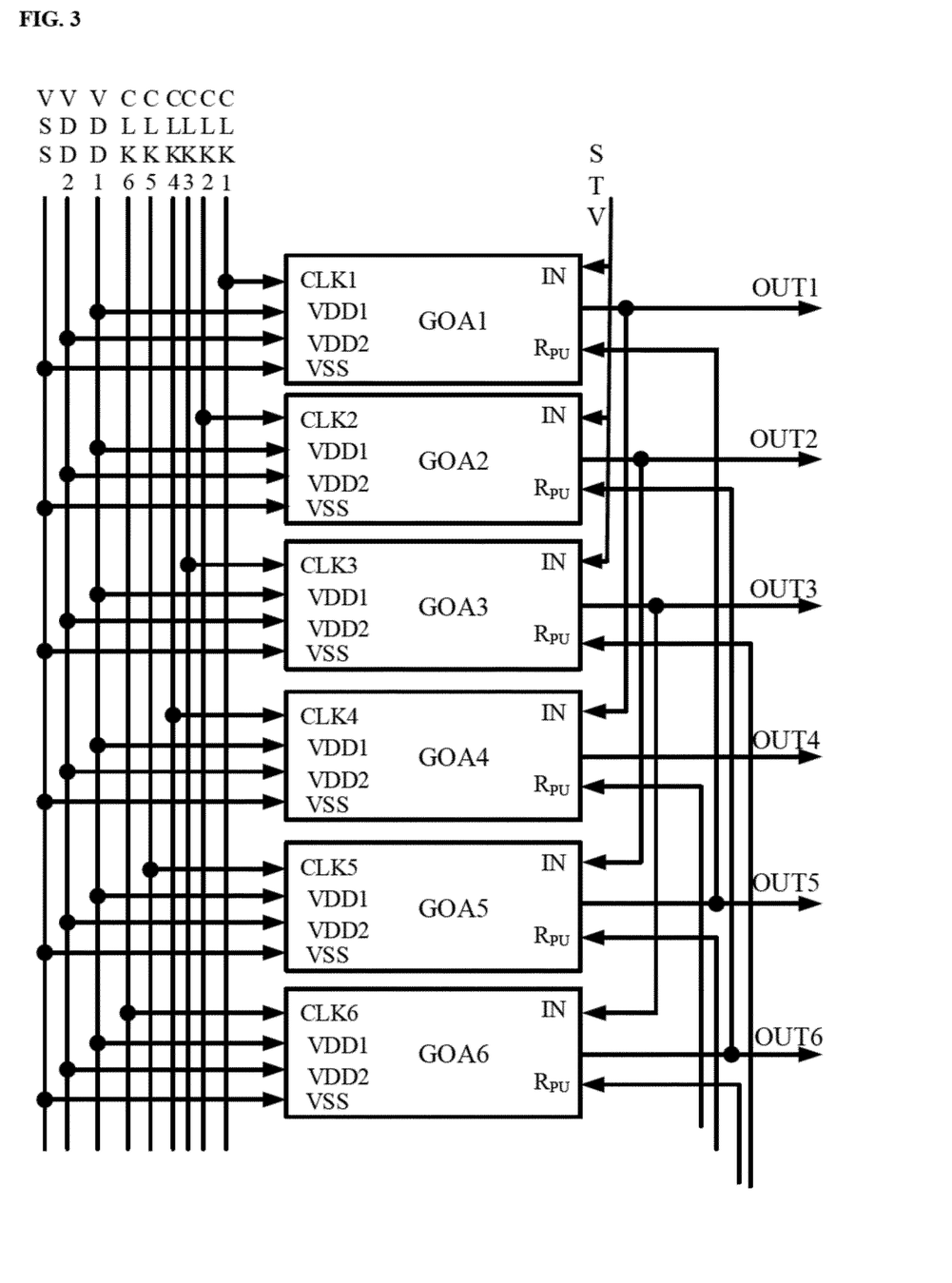
FIG. 3 is an exemplary structure diagram of a GOA circuit including a plurality of GOA units cascaded in series with a n+4 reset configuration according to some embodiments of the present disclosure.

FIG. 3 is an exemplary structure diagram of a GOA circuit including a plurality of GOA units cascaded in series with a n+4 reset configuration according to some embodiments of the present disclosure. Referring to FIG. 3, six GOA units, GOA1, GOA2, GOA3, GOA4, GOA5, and GOA6 are shown to be part of the plurality of GOA units cascaded in series to form the GOA circuit. In the example, the six GOA units form a first group of M groups of the plurality of GOA units. The GOA circuit includes N=6 clock signal lines through which N=6 clock signals are provided by a timing controller (TCON) respectively to the six GOA units of the first group. The 6 clock signals are also provided respectively to six GOA units of each of other M−1 groups in the GOA circuit, though not shown in FIG. 3. Each GOA unit also receives two high-level power-supply voltages VDD1 and VDD2 and one low-level power-supply voltage VSS. Each of the six GOA units (e.g., GOAn, n=1, 2 . . . , 6) includes an input port IN, a reset port $R_{PU}$, and an output port OUTn (n=1, 2, 3, . . . , 6).

The GOA circuit is designed to have a n+4 reset configuration in which 6 clock signals are selected as a group outputted to the GOA units in each of M groups of GOA units. Referring to FIG. 3, in the n+4 reset configuration, the reset port $R_{PU}$ of the first GOA unit, GOA1 (n=1), receives a reset signal from output port OUT5 of the fifth GOA unit, GOA5 (n+4=5). Similarly, the reset port $R_{PU}$ of GOA2 receives a reset signal from OUT6 of GOA6. The same n+4 reset configuration is followed throughout the rest of GOA units. The input ports of GOA1, GOA2, and GOA3 all receives a start signal STV externally. The input port IN of GOA4 receives an output signal from OUT1 of GOA1 as the start signal for GOA4. Similarly, the input port IN of GOA5 receives a start signal from OUT2 of GOA2. The same n−3 start configuration is followed for other GOA units. The GOA circuit of FIG. 3 is merely illustrated as an example, the present method is applicable to any appropriate reset configurations or start configurations.

Figure 4:
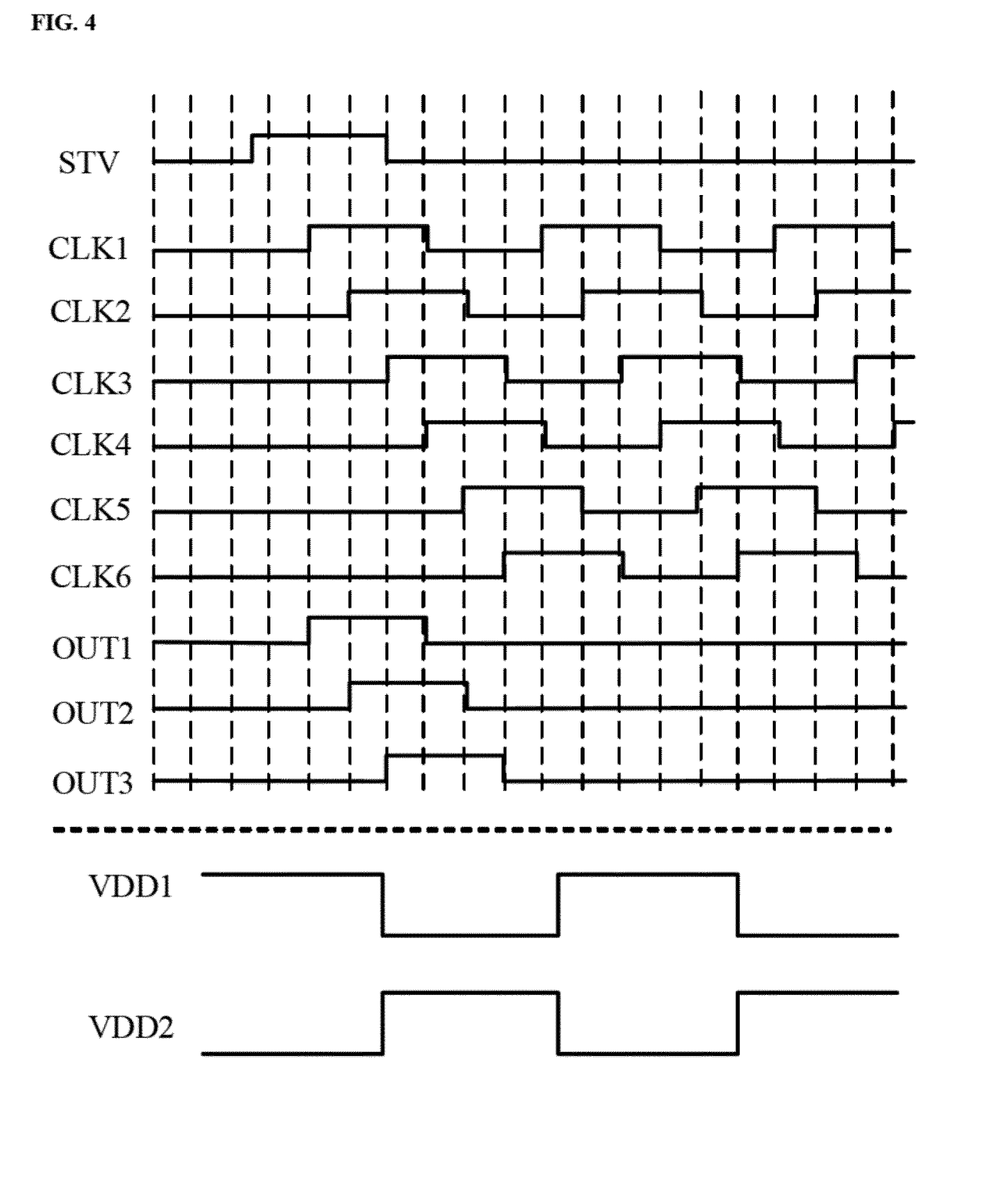
FIG. 4 is an exemplary timing waveform of multiple clock signals for operating the GOA circuit of FIG. 3 according to some embodiments of the present disclosure.

FIG. 4 is an exemplary timing waveform of multiple clock signals for operating the GOA circuit of FIG. 3 according to some embodiments of the present disclosure. The timing waveform further illustrates how the GOA circuit is operated, in particular, when multiple clock signals are provided to drive the plurality of GOA units cascaded in series. Referring to FIG. 4, corresponding to the GOA circuit of FIG. 3, N=6 clock signals, CLK1, CLK2, CLK3, CLK4, CLK5, and CLK6 are provided respectively through N=6 clock signal lines with a sequential time-delay from the 1st clock signal CLK1 to the last clock signal CLK6. In a specific embodiment, each clock signal is a square wave with a same period. The square wave is characterized by a high-level pulse in each period. Optionally, the pulse width takes half the period (e.g., with a duty cycle of 50%). Optionally, the pulse width can take other percentages of the period (e.g., with a duty cycle of a value other than 50%). In another embodiment, the pulse width is 3/N of one period of the clock signal and the time-delay of any pair of subsequent clock signals is 1/N of one period.

Referring to both FIG. 4 and FIG. 3, the 1st clock signal CLK1 is firstly applied with a first pulse to the GOA1 based on a preset GOA timing and effectively drive GOA1 to output a gate-driving signal to the output port OUT1. Subsequently, CLK2 with its first pulse drives GOA2, CLK3 with its first pulse drives GOA3, . . . , and CLK6 with its first pulse drives GOA6 to respectively output a gate-driving signal to OUT2, OUT3, . . . , and OUT6. Each OUTn signal is in-phase with each corresponding CLKn clock signal. The GOA timing would continue to allow the six clock signals to be provided through the 6 clock signal lines to next group of GOA units such that the second pulse of CLK1 is applied to GOA7 (not shown), which is also a first GOA unit of a next group, e.g., the 2nd group of the M groups of the GOA units. Similarly, the second pulses of other 5 clock signals are sequentially and respectively provided to other 5 GOA units in the second group, and so on.

Due to the setting of pulse width and clock time-delay in relation to one clock period of each clock signal, all six pulses in a same clock period of six clock signals have their rising edges within the one clock period of time. For example, the rising edge of the second pulse of the 1st clock signal CLK1 appears subsequent to the rising edge of the first pulse of the last (6-th) clock signal CLK6. Therefore, under a normal operation condition when each of the 6 clock signals is provided with M pulses for a duration, all GOA units in the M groups will receive a total of M×6 high-level pulses in the duration which are used to drive the GOA circuit to output M×6 gate-driving signals respectively to M×6 gate lines for driving the TFT-LCD to display one frame of image. This duration thus corresponds to a scanning period of one frame of image. Alternatively, as the last pulse of the 6-th clock signal is provided (represented by its rising edge of the pulse) to the last GOA unit of the GOA circuit to drive it to output a gate-driving signal, it suggests that the GOA circuit just provides one last gate-driving signal to complete the scanning of one frame of image. For example, for an FHD panel with 1080 gate lines, in one frame of image, a total of 1080 lines need to be scanned. The GOA circuit needs to receive 6 clock signals, each with 180 pulses being sequentially provided in one scanning period of a frame of time. FIG. 3 shows only one example, variations in the number of clock signals, time-delay of any pair of subsequent clock signals, period of each clock signal, pulse width of each clock signal can be implemented.

Figure 5:
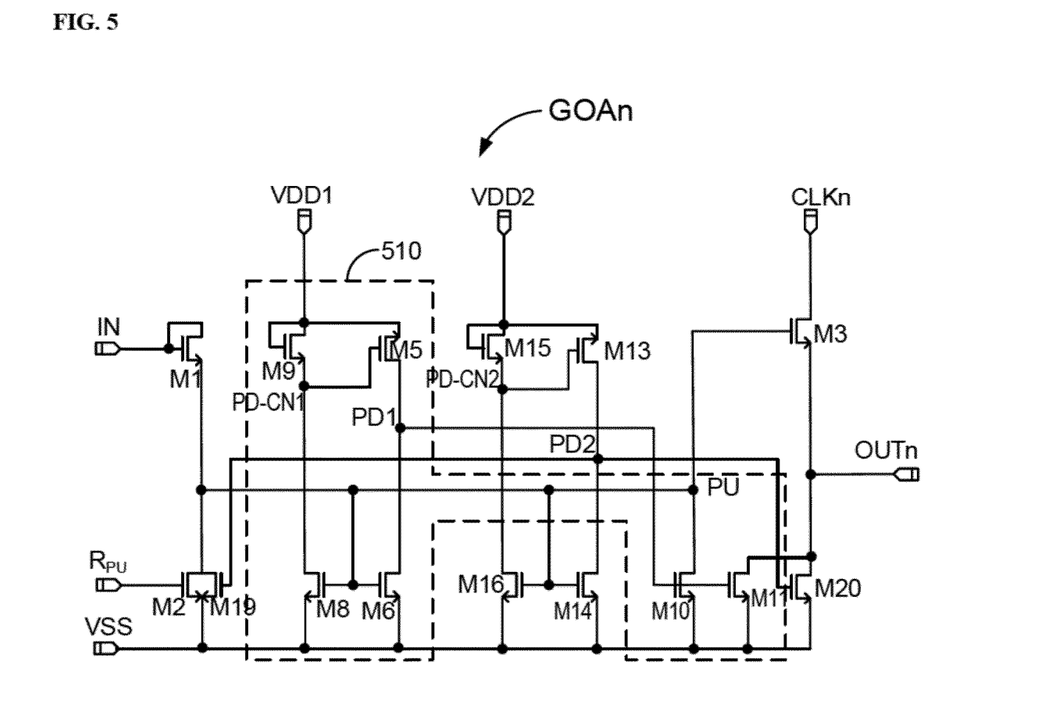
FIG. 5 is an exemplary circuit diagram of a GOA unit according to some embodiments of the present disclosure.

FIG. 5 is an exemplary circuit diagram of a GOA unit according to some embodiments of the present disclosure. As shown in this example, the GOAn unit can be any one of the six GOA units shown in FIG. 3. In some embodiments, the GOAn unit includes 15 transistors in a circuit with an input IN port, a reset $R_{PU}$ port, a VDD1 port, a VDD2 port, a clock signal port CLKn, and an output port OUTn, corresponding to the ports shown in FIG. 3. Under a normal operation condition, the CLKn port receives a clock signal (one of 6 clock signals in FIG. 3) with square wave high-level pulses and correspondingly the OUTn port outputs a gate-driving signal used for controlling a display of a line of image.

In a specific embodiment, each GOA unit includes a charge-releasing sub-circuit 510 (the box encircled by the dashed lines in FIG. 5) configured to release residual charges in the GOA circuit. The charge-releasing sub-circuit 510 in some embodiments include transistors M5, M6, M8, M9, M10, and M1, coupled with a pull-down node PD1, a pull-down control node PD-CN1, and a pull-up node PU. M5 has a gate coupled to PD-CN1, a first terminal provided with the high-level power-supply voltage VDD1 (at a particularly assigned reset time period in each GOA unit operation cycle), and a second terminal coupled to a pull-down node PD1. M10 has a gate coupled to the pull-down node PD1, a first terminal provided with the low-level power-supply voltage VSS, and a second terminal coupled to the pull-up node PU. M6 has a gate coupled to the pull-up node PU, a first terminal supplied with VSS, and the second terminal coupled to the pull-down node PD1. M9 has a gate and a first terminal commonly supplied with the high-level power-supply voltage VDD1 and a second terminal coupled to PD-CN1 node. The high-level power-supply voltage VDD1 pushes the potential of PD-CN1 to high-level and turns on the transistor M5 to make the potential of the pull-down node PD1 at high-level. The high-level potential of PD1 turns on the transistor M10 to pull down the potential of the pull-up node PU to the low-level of VSS, while the low-level potential at PU keeps M6 and M8 off to maintain node PD1 and PD-CN1 at high-level. As the potential of the pull-up node PU is pulled down, the residual charges associated with this GOA unit is released to a low-level potential which is usually set to ground (VSS). Then the low-level potential at PU will keep the transistor M3 off to prevent any clock signal CLKn falsely being outputted through M3 to the output port OUTn. High-level potential of PD1 also turn on M11 to connect the OUTn to the low-level potential, i.e., leading the GOA unit to output a low-level signal.

FIG. 5 merely is an example, variations in circuit design of the GOA unit yet still receiving a high-level power-supply voltage VDD and a low-level power-supply voltage VSS may lead to different circuit nodes with residual charges during its operation especially when some clock signal CLKn is not properly outputted. The charge-releasing sub-circuit 510 in FIG. 5 accordingly may be also replaced by other alternative sub-circuit associated with the two power-supply voltages VDD and VSS for releasing residual charges in the different nodes. Optionally, the GOA unit may include a second charge-releasing sub-circuit that is a substantial duplicate of the charge-releasing sub-circuit 510. As shown in FIG. 5, the second charge-releasing sub-circuit may includes transistors M13. M14. M15. M16, and M20, coupled with a second pull-down node PD2, a second pull-down control node PD-CN2, and the pull-up node PU. If a high-level voltage VDD2 is supplied to a first terminal of transistor M15, a similar charge-releasing effect at the pull-up node PU can be realized and the GOA unit only outputs a low-level signal at the OUTn port. In some embodiments, the second charge-releasing sub-circuit is used in alternative time period of operating the GOA unit. Also note, the high-level power-supply voltage VDD1 is not supplied to the charge-releasing sub-circuit 510 all time but at a specifically designed reset time period to ensure a normal gate-driving signal to be output to the OUTn port following a preset GOA timing while the residual charges at the pull-up node PU being properly released within the operation cycle.

Referring back to FIG. 2, the method of preventing false output of a GOA circuit includes providing N clock signals time-sequentially from a 1st clock signal first to a N-th clock signal last respectively to the N GOA units in each of the M groups of GOA units of a GOA circuit (which has total M×N GOA units). In an embodiment, each sequentially next outputted clock signal has a time-delay relative to a previously outputted clock signal. Optionally, the time-delay is the same for any pair of subsequently outputted clock signals Optionally, each of the N clock signals has a same period and the time-delay is set to be 1/N of the period of each clock signal, although other options are possible. In an embodiment, each clock signal is characterized by a high-level pulse voltage provided in half period of each clock signal, i.e., the pulse width is 3/N of the period of the clock signal. Each pulse is associated with one rising edge. In normal operation, the N clock signals are provided by a TCON controller based on a preset GOA timing which sets a start time for the 1st clock signal, then a 2nd clock signal with the time-delay, and so on. Effectively for each clock signal, a first high-level pulse voltage is applied to one GOA unit of the 1st group of the M groups of GOA units in a first period of the clock signal and each subsequent next high-level pulse voltage is then applied to another one GOA unit of each subsequent next group of the M groups of GOA units in each subsequent next period of the clock signal. Thus, each of the N clock signals needs M pulses to ensure each of total M×N GOA units to receive one clock signal for driving it to output a gate-driving signal for finishing one scanning period of a frame of image.

Referring to FIG. 2, the method of preventing false output of a GOA circuit further includes counting a first total number of pulses of first clock signal and a second total number of pulses of the N-th clock signal for a duration corresponding to a scanning period of a frame of image. Additionally, the method includes comparing the first total number of pulses and the second total number of pulses to M. Based on the GOA circuit configuration described above, the total number of pulses of each clock signal obtained in a duration corresponding to a scanning period of a frame of image can be used to determine if any clock signal fails to reach a corresponding GOA unit in the GOA circuit so that a frame of image is not fully completed. Since the N clock signals are provided in time-sequential manner with a time-delay from the 1st clock signal to the N-th clock signal and continues in the same pattern through rest of time of each scanning period of a frame of image, the 1st pulse of the 1st clock signal records the start information of each scanning period and the last pulse of the N-th clock signal records the end information of each scanning period. But each of the 1st clock signal and the N-th clock signal only provides total number of M pulses for the GOA circuit to generate all gate-driving signals for the duration of one frame of image. Therefore, counting the total number of pulses for both the 1st clock signal and the N-th clock signal and comparing to M would lead a determination that how many pulses are actually provided to corresponding number of GOA units within the duration of scanning period of a full frame of image. The determination can be used to generate a reset signal for timing controller to trigger a reset operation for the GOA circuit to clear the abnormality caused by incomplete outputs of some clock signals within any scanning period of a frame of image.

Figure 6:
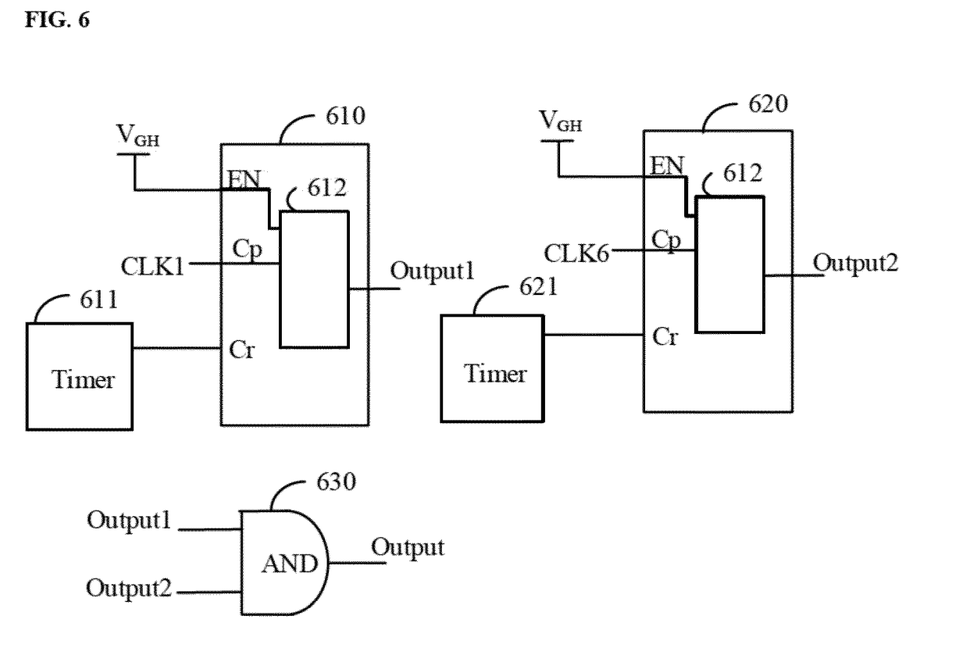
FIG. 6 is a schematic diagram showing a method of generating a reset signal based on counting total number of pulses of at least a 1st clock signal and a last clock signal of the multiple clock signals for operating a GOA circuit according to some embodiments of the present disclosure.

As illustrated in FIG. 4, each pulse of the clock signal is typically a high-level square form so that count the number of pulses can be executed by using a pulse counter to count number of rising edges of the pulses over any duration of providing the clock signal. FIG. 6 is a schematic diagram showing a method of generating a reset signal based on counting total number of pulses of at least a 1st clock signal and a last clock signal of the multiple clock signals for operating a GOA circuit according to some embodiments of the present disclosure. Referring to FIG. 6, the step of counting number of pulses is performed using a pulse counter. For example, the first clock signal CLK1 is counted by a first pulse counter 610 and the N-th (or 6-th) clock signal CLK6 is counted by a second pulse counter 620. Each pulse counter, for example 610, is enabled by applying a high-level fixed voltage $V_{GH}$ to an enable port EN and receives the clock signal at an input port Cp. Since the clock signal is characterized by a set of high-level pulses passed over a duration of counting interval, the high-level fixed voltage $V_{GH}$ is able to detect the rising edge of each pulse and effectively to allow the pulse counter 610 to count a number one whenever a rising edge of a pulse of the CLK1 is received at the input port Cp. The pulse counter 610 is coupled via a timing port Cr to a timer 611 used to set a start time for turning on the pulse counter 610 and an end time for clearing the pulse counter 610. After the timer 611 is turning on the pulse counter 610 at the start time, every rising edge of a high-level pulse of the clock signal CLK1 received by the input port Cp of the pulse counter 610 triggers one count with the counted number being accumulated over time. The timer 611 also sends a clear signal to the pulse counter 610 when the end time is reached so the pulse counter 610 is cleared after the total counted number in the duration between the start time and the end time is sent to a comparator 612. The pulse counter 610 is cleared and ready to perform a new round of counting controlled by the timer 611. The configuration of the second pulse counter 620 is substantially the same as the first pulse counter 610, which is used to count a total number of pulses of the N-th clock signal (CLK6) in a duration of counting interval controlled by a timer 621. The duration of counting interval for both the first pulse counter 610 and the second pulse counter 620 are set respectively by timer 611 and timer 621 substantially the same as the duration of scanning period of a full frame of image.

As described earlier, each clock signal in normal operation condition should output M pulses in each scanning period of a frame of image. The comparator associated with each pulse counter is configured to determine whether the total number of pulses counted within the duration of counting interval set by the timer is smaller than or equal to M and generate an output signal to an output port of the pulse counter. Referring to FIG. 6, the first pulse counter 610 uses the first comparator 612 to compare the counted first total number of pulses of the first clock signal to M and to output a first output signal Output1 generated and the second pulse counter 620 uses the second comparator 622 to compare the counted second total number of pulses of the N-th or last clock signal to M and to output a second output signal Output2. Optionally, either Output1 or Output 2 can be set to a high-level signal based on a determination that the first or second total number of pulses is equal to M or set to a low-level signal based on a determination that the first or second total number of pulses is smaller than M.

Referring to FIG. 2 again, the method of preventing false output of a GOA circuit further includes generating a reset signal based on a determination that at least one of the first total number of pulses and the second total number of pulses is smaller than M. As described in earlier section, the determination that at least one of the first total number of pulses and the second total number of pulses is smaller is obtained through both the first comparator 612 associated with the first pulse counter 610 and the second comparator 622 associated with the second pulse counter 620. A logic AND device 630 is employed to further process the two output signals from the first pulse counter 610 and the second pulse counter 620. Specifically, the logic AND device 630 outputs a high-level signal when both Output1 and Output2 are high-level signals and outputs a low-level signal when at least one of Output1 and Output2 is a low-level signal. The output of the logic AND device 630 is sent to timing controller TCON associated with the TFT-LCD display panel. When the output of the logic AND device 630 is a high-level signal, it is a normal signal for the timing controller TCON to maintain the preset GOA timing of providing all corresponding control signals including the N clock signals to the GOA circuit. When the output of the logic AND device 630 is a low-level signal, it is a reset signal to trigger the timing controller TCON to perform a reset operation without needs of any reset GOA unit.

Referring to FIG. 2, the method of preventing false output of a GOA circuit includes releasing residue charges in the GOA circuit before outputting any gate-driving signal for a duration of scanning period of at least one full frame of image (e.g., 1, 2, . . . , n frames of image, n is an integer≥1). In some embodiments, a reset GOA unit as one of a plurality of GOA units cascaded in series in the typical GOA circuit may be used to perform a charge releasing operation on all GOA units cascaded in series. But for any GOA circuit without a reset GOA unit, e.g., in narrow-border or borderless TFT-LCD display panel, the method of the present disclosure provides a unique way to perform a reset operation without the reset GOA unit to release residual charges caused by abnormal clock signal outputs in the latest scanning period of a frame of image. In an embodiment, when the timing controller TCON receives the reset signal, a low-level signal, outputted from the logic AND device, it will supply a high-level power-supply voltage VDD to each GOA unit in the cascaded series for a duration of time. Referring to FIG. 5, this high-level power-supply voltage is VDD1 applied to the charge-releasing sub-circuit 510 (or VDD2 applied to a second charge-releasing sub-circuit). As described earlier about the charge-releasing sub-circuit 510 with the supplies of both VDD1 and VSS, it can effectively pull down potential of the pull-up node PU to a low-level to release the residual charges that are built up during the generation of gate-driving signal to the output. The timing controller TCON is configured to perform the reset operation by keeping the VDD1 (or VDD2) at high-level for all GOA units for the duration of time to ensure fill release of residual charges of the GOA circuit. The duration of time can be a fraction of a scanning period of a frame of image or other time long enough to ensure the charge-releasing operation is successfully performed. Preferably, the duration of time is a scanning period of a frame of time. Optionally, the duration of time is two scanning periods. During the duration of time, no clock signal is provided and no high-level gate-driving signal which could be false otherwise is outputted from any GOA unit. Instead, the output port of any GOA unit in the GOA circuit is kept at a low-voltage level of VSS. The image display of the display panel is suspended for the duration of time.

Figure 7:
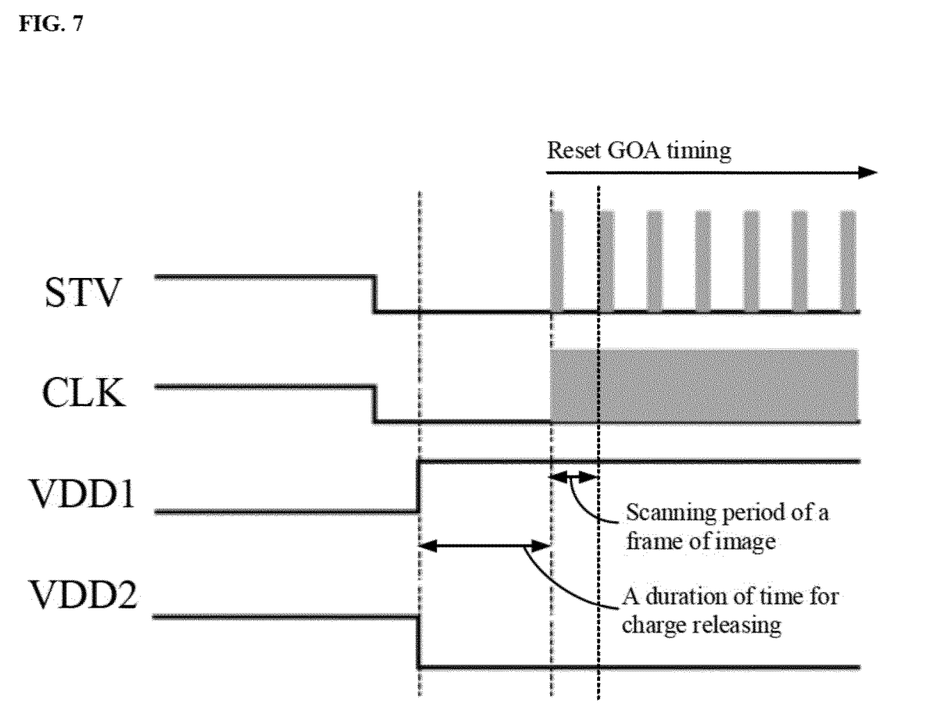
FIG. 7 is a schematic diagram showing a method of resetting GOA timing and releasing residual charges in a GOA circuit for preventing false output according to some embodiments of the present disclosure.

In another embodiment, the timing controller TCON is configured to reset original GOA timing to a second GOA timing after receiving the reset signal. FIG. 7 is a schematic diagram showing a method of resetting GOA timing and releasing residual charges in a GOA circuit for preventing false output according to some embodiments of the present disclosure. Referring to FIG. 7, the timing controller TCON is performing the reset operation by discontinuing the STV signal and N clock signals outputted to the GOA circuit for the duration of time for charge releasing. This ensures no gate-driving signal, which could be a false multi-pulse output, can be outputted during the duration of time for performing the reset operation. The second GOA timing is substantially the same as the original GOA timing in terms of providing all control signals including the start signal, N clock signals, and others except that the second GOA timing is delayed relative to the original GOA timing by the duration of time. The duration of time is selected by timing controller TCON for providing the high-level VDD voltage to release residual charges in the GOA circuit. At the end of the duration or start of the second GOA timing, the timing controller TCON resumes providing the N clock signals according to the second GOA timing for continuing the operation of the GOA circuit for generating all gate-driving signals for next frame of image and more. Referring to FIG. 7, the timing controller TCON also suspends providing start signal STV to initiate the operation of GOA units (particularly the first few GOA units, for example, GOA1, GOA2, and GOA3, as shown in FIG. 3). When the second GOA timing as a reset GOA timing starts, the first STV signal is sent to GOA1 (as well as to GOA2 and GOA3 as shown in FIG. 3) to start the whole series of GOA units.

If the timing controller TCON receives a high-level signal from the logic AND device 630, then TCON takes no extra action but to maintain the original GOA timing to provide STV signal, N clock signals, and others for driving the GOA circuit for providing gate-driving signals to control pixel circuits of the TFT-LCD display panel in subsequent next scanning period of a frame of image.

Optionally, the method of the present disclosure is applicable for preventing false output of gate-driving signals used for driving any TFT-based display panel, including TFT-LCD, AMOLED, and others.

In an alternative aspect, the present disclosure provides a TFT-based display panel capable of performing self-reset operation for releasing residual charges caused by abnormal clock signals outputs. The TFT-based display panel includes a Gate Driver on Array (GOA) circuit having M groups of GOA units cascaded in series, each of the M groups of GOA units having N GOA units cascaded in series. The GOA circuit also includes N clock signal lines each of which is connected to one of the N GOA units in each M groups of GOA units, M and N are integer. In an embodiment, an extra reset GOA unit may be eliminated from the series of cascaded GOA units. FIG. 3 shows an example of the GOA circuit included in the TFT-based display panel. Additionally, the TFT-based display panel includes a timing controller configured to set a first GOA timing for providing N clock signals sequentially from a 1st clock signal to a N-th clock signal respectively through the N clock signal lines to the N GOA units in one group sequentially from a 1st group to a M-th group of the M groups of GOA units for outputting MN gate-driving signals from the GOA circuit in each scanning period of a frame of image. FIG. 4 shows an exemplary timing waveform of key control signals supplied from the timing controller for operating the GOA circuit of FIG. 3. Particularly, N=6 clock signals are provided sequentially with a time-delay from a 1st clock signal to a last N=6-th clock signal to a group of 6 GOA units sequentially from a first group to last group in the cascaded series. The self-reset operation is performed by the timing controller based on a detection of abnormal outputs of the N clock signals from the timing controller within one scanning period of a frame of image. The TFT-based display panel can be TFT-LCD display panel, or AMOLED display panel, or others that uses cascaded GOA units for driving an active matrix of pixel circuits for image display.

Furthermore, for detecting the abnormal clock signal outputs through the N clock signal lines to the GOA units in the GOA circuit, the TFT-based display panel further includes a first pulse counter to count a first number of pulses of the 1st clock signal provided within the each scanning period of a frame of image and a second pulse counter to counter a second number of pulses of the N-th clock signal provided in the each scanning period of a frame of image. The first pulse counter and the second pulse counter can be integrated within the timing controller. Each pulse counter includes an enable port receiving a high-level voltage to enable counting of rising edges of pulses of the clock signal (either the 1st clock signal or the N-th clock signal) through an input port within a duration of counting interval set by a timer. The timer is configured to set the duration of counting interval as the same as the duration of scanning period of a full frame of image and set a start time to count total number of pulses in the duration and an end time of the duration of counting interval at which the pulse counter will be cleared and the total number counted is compared to M by a comparator associated with the pulse counter. Since in normal operation condition, each clock signal is supposed to output M pulses. Correspondingly, as a first pulse of the 1st clock signal is outputted the scanning period of a frame of image is started and as the last (or M-th) pulse of the N-th clock signal is outputted the scanning period of a frame of image is ended.

Based on the TFT-based display panel configured as above, the timing controller is configured to reset the first GOA timing to a second GOA timing based on a reset signal indicating that at least one of the first number of pulses and the second number of pulses is smaller than M. The second GOA timing is configured the same as the first GOA timing in terms of providing the start signal STV, the N clock signals, and other control signals except being delayed from the first GOA timing by a duration of time. The timing controller is configured to release residual charges in each GOA unit for the duration of time without outputting any gate-driving signal before providing the N clock signals based on the second GOA timing. In particular, the timing controller is configured to provide a high-level power-supply voltage to a charge-releasing sub-circuit that is existed in each GOA unit of the GOA circuit to release residual charges thereof within the duration of scanning period of at least one full frame of image (e.g., 1, 2, . . . . n frames of image, n is an integer≥1). FIG. 5 shows an exemplary circuit of a GOA unit which includes a charge-releasing sub-circuit designed to release charges at the pull-up node during a traditional predetermined reset phase of operating the GOA unit. The timing controller, when receiving the reset signal, is configured to specifically allocate the duration of time for supplying the high-level voltage for enforcing the charge release of the pull-up node using the existing charge-releasing sub-circuit. Alternatively, the timing controller discontinues providing the N clock signals to the GOA circuit during the same duration of time to ensure no (high-level, multi-pulse) false gate-driving signal is outputted from any one of GOA unit in the duration of time. Effectively, the timing controller resets the first GOA timing to a second GOA timing that is merely delayed by the duration of time. Optionally, the duration of time can be any fraction of scanning a frame of image. Optionally, the duration of time is a scanning period of a full frame of image. Optionally, the duration of time is a period of two frames of image. At the end of the duration of time for performing self-reset operation, the timing controller is triggered by the second GOA timing to resume providing the N clock signals through the N clock signal lines to the N GOA units in each group sequentially from a first group to M-th group of the cascaded series.

Alternatively, the timing controller is configured to maintain the first GOA timing based on a high-level signal outputted by the logic AND device to provide the N clock signals in a subsequent next scanning period of a frame of image for outputting M×N gate-driving signals sequentially from the 1st GOA unit of the 1st group to the N-th GOA unit of the M-th group.

In another aspect, the present disclosure provides a display apparatus having a TFT-LCD or AMOLED display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel comprising:
a Gate Driver on Array (GOA) circuit comprising M groups of GOA units cascaded in series, each of the M groups of GOA units comprising N GOA units cascaded in series; and N clock signal lines each of which is connected to one of the N GOA units in each M groups of GOA units, M and N are positive integers greater than zero;
a controller configured to set a first GOA timing for providing N clock signals sequentially from a first clock signal to a N-th clock signal respectively through the N clock signal lines to the N GOA units in one group sequentially from a first group to a M-th group of the M groups of GOA units for outputting M×N gate-driving signals from the GOA circuit in each scanning period of a frame of image;
a first pulse counter to count a first number of pulses of the first clock signal provided within the each scanning period;
a second pulse counter to count a second number of pulses of the N-th clock signal provided in the each scanning period;
wherein the controller is configured to reset the first GOA timing to a second GOA timing based on a reset signal indicating that at least one of the first number of pulses and the second number of pulses is smaller than M, the second GOA timing being delayed from the first GOA timing by a duration of time, wherein the controller is configured to release residual charges in each GOA unit for the duration of time without outputting any gate-driving signal before providing the N clock signals based on the second GOA timing.

2. The display panel of claim 1, wherein the N clock signals sequentially from the first clock signal to the N-th clock signal are provided with a time-delay between any pair of subsequent clock signals.

3. The display panel of claim 2, wherein the time-delay equals to 1/N of one period of each clock signal.

4. The display panel of claim 3, wherein each of the N clock signals applies a first high-level pulse voltage in a first period of the clock signal to one GOA unit of the first group of the M groups of GOA units and applies each subsequent next high-level pulse voltage in each subsequent next period of the clock signal to another one GOA unit of each subsequent next group of the M groups of GOA units.

5. The display panel of claim 1, wherein the first pulse counter is configured to receive the first clock signal and enable counting of numbers of rising edges of pulses of the first clock signal to obtain the first total number of pulses within a duration of scanning period of a full frame of image; and the second pulse counter is configured to receive the N-th clock signal and enable counting of numbers of rising edges of pulses of the N-th clock signal to obtain the second total number of pulses within the duration of scanning period of a full frame of image.

6. The display panel of claim 5, further comprises a first timer coupled to the first pulse counter and a second timer coupled to the second pulse counter;
wherein each of the first timer and the second timer is configured to independently define a duration of counting interval to be the duration of scanning period of a full frame of image;
the first timer is configured to send a first clear signal to the first pulse counter for clearing the first pulse counter at an end of the duration of counting interval; and
the second time is configured to send a second clear signal to the second pulse counter for clearing the second pulse counter at the end of the duration of counting interval.

7. The display panel of claim 5, wherein the first pulse counter comprises a first comparator configured to compare the first total number of pulses to M and to output a first output signal, wherein the first output signal is a high-level signal indicating a determination that the first total number of pulses is equal to M or a low-level signal indicating a determination that the first total number of pulses is smaller than M; the second pulse counter comprises a second comparator configured to compare the second total number of pulses to M and to output a second output signal, wherein the second output signal is a high-level signal indicating a determination that the second total number of pulses is equal to M or a low-level signal indicating a determination that the second total number of pulses is smaller than M.

8. The display panel of claim 7, further comprises a logic AND device to receive the first output signal from the first pulse counter and the second output signal from the second pulse counter and to output a low-level signal as the reset signal indicating that at least one of the first output signal and the second output signal is a low-level signal or to output a high-level signal indicating that each of the first output signal and the second output signal is a high-level signal.

9. The display panel of claim 8, wherein the controller is configured to maintain the first GOA timing based on the high-level signal outputted by the logic AND device to provide the N clock signals in a subsequent next scanning period of a frame of image for outputting M×N gate-driving signals sequentially from the first GOA unit of the first group to the N-th GOA unit of the M-th group.

10. The display panel of claim 1, wherein the controller is configured to discontinuing the N clock signals based on the reset signal for the duration of time before providing the N clock signals based on the second GOA timing.

11. The display panel of claim 10, wherein the controller is configured to provide a high-level power-supply voltage to a charge-releasing sub-circuit of each GOA unit in the GOA circuit to release residual charges thereof within the duration of time.

12. A method for preventing false output of a Gate Driver on Array (GOA) circuit in a display panel, the GOA circuit comprising M groups of GOA units cascaded in series, each of the M groups of GOA units comprising N GOA units cascaded in series, and N clock signal lines each of which is connected to one of the N GOA units in each of the M groups of GOA units, M and N are positive integers greater than zero;
the method comprising:
providing N clock signals time-sequentially from a first clock signal to a N-th clock signal through the N clock signal lines respectively to the N GOA units in each of the M groups of GOA units;

counting a first total number of pulses of the first clock signal and a second total number of pulses of the N-th clock signal provided in a scanning period of a frame of image;

comparing the first total number of pulses and the second total number of pulses to M;

generating a reset signal based on a determination that at least one of the first total number of pulses and the second total number of pulses is smaller than M, whereby releasing residual charges in the GOA circuit before outputting any gate-driving signal for a duration of time based on the reset signal.

13. The method of claim 12, wherein providing N clock signals comprises sequentially outputting the N clock signals from the first clock signal to the N-th clock signal with a time-delay being equal to 1/N of one period of each clock signal.

14. The method of claim 13, wherein each of the N clock signals applies a first high-level pulse voltage in a first period of the clock signal to one GOA unit of the first group of the M groups of GOA units and applies each subsequent next high-level pulse voltage in each subsequent next period of the clock signal to another one GOA unit of each subsequent next group of the M groups of GOA units.

15. The method of claim 12, wherein counting comprises obtaining the first total number of pulses within each scanning period of one frame of image using a first pulse counter including an input port receiving the first clock signal and an enable port receiving a high-level voltage to enable counting of numbers of rising pulse edges of the first clock signal, the scanning period of one frame of image is set by a timer which is configured to clear the first pulse counter at an end of the each scanning period; and obtaining the second total number of pulses within each scanning period of one frame of image using a second pulse counter including an input port receiving the N-th clock signal and an enable port receiving a high-level voltage to enable counting of numbers of rising edges of pulses of the N-th clock signal, the scanning period of one frame of image is set by a timer which is configured to clear the second pulse counter at an end of the each scanning period.

16. The method of claim 15, wherein comparing comprises comparing the first total number of pulses to M using a first comparator associated with the first pulse counter and outputting a first output signal, wherein the first output signal is a high-level signal indicating that the first total number of pulses is equal to M or is a low-level signal indicating that the first total number of pulses is smaller than M; and comparing the second total number of pulses to M using a second comparator associated with the second pulse counter and outputting a second output signal, wherein the second output signal is a high-level signal indicating that the second total number of pulses is equal to M or is a low-level signal indicating that the second total number of pulses is smaller than M.

17. The method of claim 16, wherein generating the reset signal comprises receiving the first output signal from the first pulse counter and the second output signal from the second pulse counter by a logic AND device; and outputting by the logic AND device a low-level signal as the reset signal based on that at least one of the first output signal and the second output signal is a low-level signal or outputting a high-level signal based on that each of the first output signal and the second output signal is a high-level signal.

18. The method of claim 17, further comprising maintaining a timing for providing the N clock signals in a subsequent next scanning period of a frame of image based on the high-level signal outputted by the logic AND device for outputting M×N gate-driving signals sequentially from the first GOA unit of the first group to the N-th GOA unit of the M-th group.

19. The method of claim 12, further comprising discontinuing the N clock signals based on the reset signal for the duration of time before providing the N clock signals in a next scanning period of a frame of image subsequently after the duration of time.

20. The method of claim 19, wherein releasing residual charges in the GOA circuit comprises providing a high-level power-supply voltage to a charge-releasing sub-circuit of each GOA unit in the GOA circuit to release residual charges thereof within the duration of time.

* * * * *